United States Patent
Hurbi

(10) Patent No.: US 10,113,095 B2
(45) Date of Patent: Oct. 30, 2018

(54) REINFORCED GRAPHITIC MATERIAL

(71) Applicant: MICROSOFT TECHNOLOGY LICENSING, LLC, Redmond, WA (US)

(72) Inventor: Erin Hurbi, San Francisco, CA (US)

(73) Assignee: MICROSOFT TECHNOLOGY LICENSING, LLC, Redmond, WA (US)

( * ) Notice: Subject to any disclaimer, the term of this patent is extended or adjusted under 35 U.S.C. 154(b) by 201 days.

(21) Appl. No.: 14/804,185

(22) Filed: Jul. 20, 2015

(65) Prior Publication Data

US 2017/0022406 A1    Jan. 26, 2017

(51) Int. Cl.
*C09K 5/00* (2006.01)
*C09K 5/14* (2006.01)
(Continued)

(52) U.S. Cl.
CPC .............. *C09K 5/14* (2013.01); *C04B 35/521* (2013.01); *C04B 35/524* (2013.01); *C04B 38/0022* (2013.01); *C23C 14/22* (2013.01); *C23C 14/5806* (2013.01); *C23C 16/44* (2013.01); *C23C 16/56* (2013.01); *C23C 18/1204* (2013.01); *C23C 18/1245* (2013.01); *C23C 18/1275* (2013.01); *C23C 18/1291* (2013.01); *C23C 18/1295* (2013.01); *F28D 15/0233* (2013.01); *F28D 15/0241* (2013.01); *F28F 21/02* (2013.01); *G06F 1/163* (2013.01); *G06F 1/1656* (2013.01); *G06F 1/203* (2013.01); *G06F 3/011* (2013.01); *C04B 2235/425* (2013.01); *C04B 2235/48* (2013.01);
(Continued)

(58) Field of Classification Search
CPC ......... C23C 14/22; C23C 14/58; C23C 16/56; C23C 18/1245; C09K 5/00
USPC ........................................................... 252/71
See application file for complete search history.

(56) References Cited

U.S. PATENT DOCUMENTS 3,026,214 A * 3/1962 Boyland ............... C04B 35/521
                                                      264/29.5
3,404,061 A * 10/1968 Bochman ............... C01B 31/00
                                                      252/378 R
(Continued)

FOREIGN PATENT DOCUMENTS

CN    102956876 A    3/2013
CN    103213980 A    7/2013
(Continued)

OTHER PUBLICATIONS

ISA European Patent Office, International Search Report and Written Opinion Issued in Application No. PCT/US2016/039475, dated Sep. 12, 2016, WIPO, 11 Pages.
(Continued)

*Primary Examiner* — Jane L Stanley
(74) *Attorney, Agent, or Firm* — Alleman Hall Creasman & Tuttle LLP

(57) ABSTRACT

Examples are disclosed that relate to the manufacture of a reinforced graphitic material. One example provides a method for making a reinforced graphitic material including sorbing an organic compound into void space of a graphitic host material, and heating the graphitic host material to pyrolyze the sorbed organic compound. Elemental carbon is thereby deposited in the void space.

17 Claims, 3 Drawing Sheets

(51) Int. Cl.

| | |
|---|---|
| C23C 14/22 | (2006.01) |
| C23C 14/58 | (2006.01) |
| C23C 16/44 | (2006.01) |
| C23C 16/56 | (2006.01) |
| C23C 18/12 | (2006.01) |
| C04B 35/52 | (2006.01) |
| C04B 35/524 | (2006.01) |
| C04B 38/00 | (2006.01) |
| F28F 21/02 | (2006.01) |
| F28D 15/02 | (2006.01) |
| G06F 1/16 | (2006.01) |
| G06F 1/20 | (2006.01) |
| G06F 3/01 | (2006.01) |

(52) U.S. Cl.
CPC .......................... C04B 2235/5292 (2013.01); C04B 2235/614 (2013.01); C04B 2235/616 (2013.01); C04B 2235/9607 (2013.01)

(56) References Cited

U.S. PATENT DOCUMENTS

| | | | | |
|---|---|---|---|---|
| 5,228,701 | A * | 7/1993 | Greinke | C04B 35/536 |
| | | | | 264/291 |
| 5,882,726 | A * | 3/1999 | Sheehan | D01F 9/16 |
| | | | | 427/228 |
| 8,865,113 | B2 | 10/2014 | Shankman | |
| 9,776,378 | B2 * | 10/2017 | Choi | B32B 9/04 |
| 2008/0248275 | A1 | 10/2008 | Jang et al. | |
| 2009/0072448 | A1 * | 3/2009 | Shi | B29C 43/222 |
| | | | | 264/405 |
| 2010/0040861 | A1 * | 2/2010 | Addiego | B01D 39/1692 |
| | | | | 428/306.6 |
| 2011/0030940 | A1 * | 2/2011 | Takeda | H01L 23/373 |
| | | | | 165/185 |
| 2011/0189452 | A1 | 8/2011 | Lettow et al. | |
| 2011/0247795 | A1 | 10/2011 | Horng | |
| 2013/0180581 | A1 * | 7/2013 | Choi | B32B 9/04 |
| | | | | 136/256 |
| 2013/0329366 | A1 | 12/2013 | Wang et al. | |
| 2014/0045072 | A1 | 2/2014 | Neumann et al. | |
| 2014/0224466 | A1 | 8/2014 | Lin et al. | |
| 2014/0225041 | A1 | 8/2014 | Archer et al. | |
| 2018/0061517 | A1 * | 3/2018 | Zhamu | C23C 16/26 |

FOREIGN PATENT DOCUMENTS

| | | |
|---|---|---|
| EP | 2289861 A1 | 3/2011 |
| EP | 2822893 A2 | 1/2015 |

OTHER PUBLICATIONS

"PGS Thermal Graphite Sheets", Published on: Dec. 14, 2012 Available at: http://www.mouser.com/new/panasonic/panasonicthermalgraphite/.

Primo, et al., "High-Yield Production of N-doped Graphitic Platelets by Aqueous Exfoliation of Pyrolyzed Chitosan", In Proceedings of Carbon, vol. 68, Mar. 2014, 7 pages.

Park, et al., "Graphene Oxide Sheets Chemically Cross-Linked by Polyallylamine", In Journal of Physical Chemistry, Aug. 18, 2009, 4 pages.

Rangappa, et al., "Supercritical Fluid Processing of Graphene and Graphene Oxide", In Proceedings of International Conference on Innovative Technologies, Sep. 1, 2011, 15 pages.

"Manufacturing Process and Material Properties of Carbon and Graphite Materials", Published on: Mar. 12, 2011 Available at: http://www.schunkgraphite.com/sixcms/media.php/1698/Kohlenstoff-Broschuere_GB.pdf.

Pu, et al., "Production of Few-Layer Graphene by Supercritical CO2 Exfoliation of Graphite", In Proceedings of Materials Letters, vol. 63, Issue 23 , Sep. 30, 2009, 2 pages.

Zhengrong, et al., "Carbon Materials from High Ash Bio-char: A Nanostructure Similar to Activated Graphene", In Proceedings of American Transactions on Engineering & Applied Sciences, vol. 2, No. 1, Nov. 20, 2012, 20 pages.

Maitra, et al., "Covalent Crosslinking of Carbon Nanostructures", In Journal of Chemical Sciences, vol. 124, Issue 3, May 2012, 6 pages.

* cited by examiner

REINFORCED GRAPHITIC MATERIAL

BACKGROUND

Heat may be generated at one location in an electronic device, but dissipated at another location. A thermal conduit may be used to carry the heat from the generation location to the dissipation location, in order to maintain the various components of the device at a desirable temperature. To this end, some electronic devices incorporate fluid-filled heat pipes, which have no moving parts, but transfer heat very efficiently. Despite these advantages, heat pipes may be costly to manufacture at high volume, especially when configured to tolerate load, flexion, and other forms of mechanical strain.

SUMMARY

Examples are disclosed that relate to reinforced graphitic materials suitable for use in heat transfer applications. One disclosed example provides a method for making a reinforced graphitic material. The method comprises sorbing an organic compound into void space of a host graphitic material, and heating the host graphitic material with the sorbed organic compound to pyrolyze the sorbed organic compound, thereby depositing elemental carbon in the void space.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to implementations that solve any or all disadvantages noted in this disclosure.

DETAILED DESCRIPTION

Figure 1:
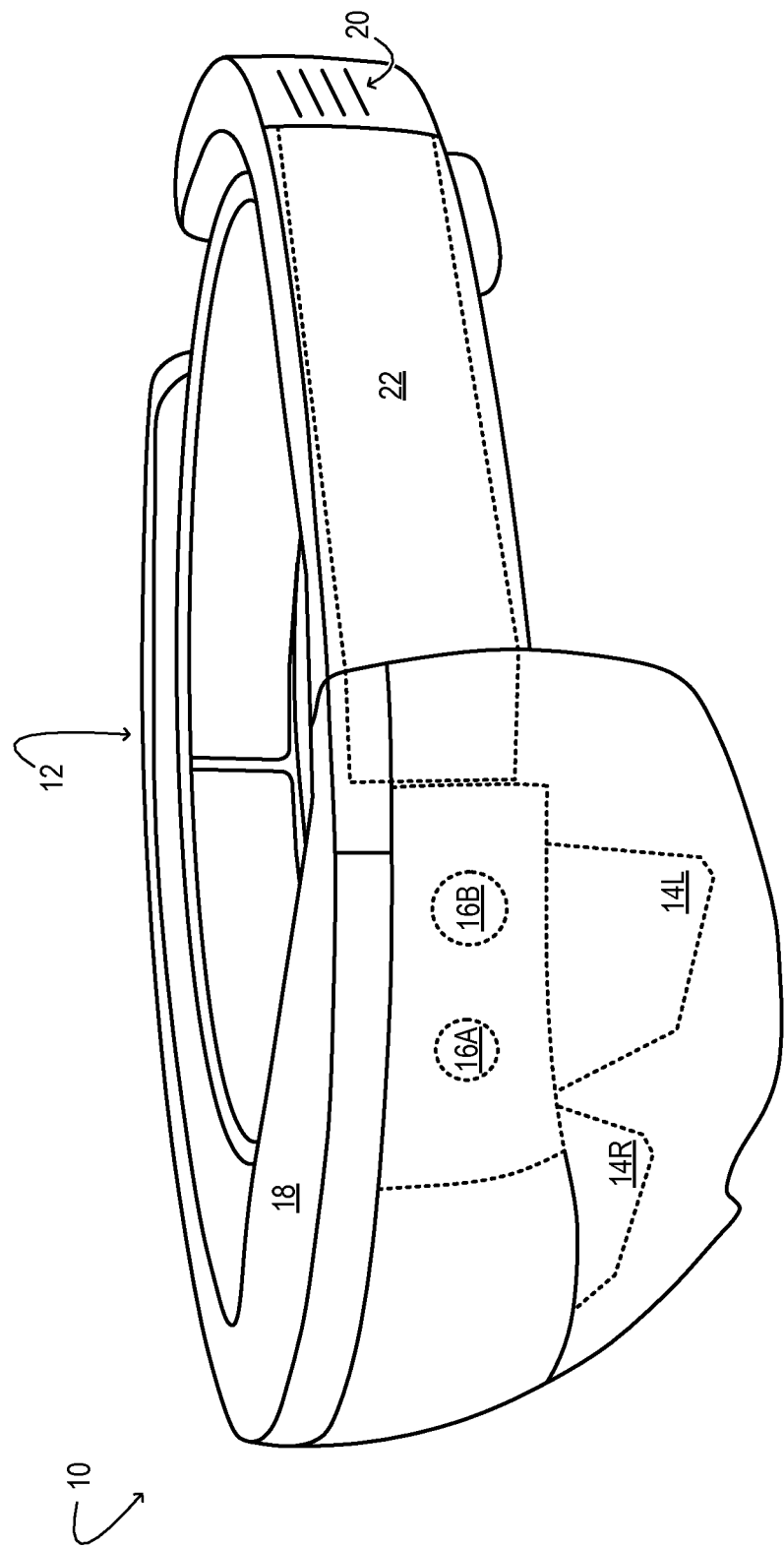
FIG. 1 shows aspects of an example electronic device.

As noted above, a fluid-filled heat pipe can be used to cool an electronic device, but configuring a heat pipe to tolerate load and strain may be cost-prohibitive for many applications. In a head-worn electronic device, for instance, conveying heat around a flexible headband through a fluid-filled heat pipe may require a bellows portion to be engineered into the heat pipe, which may increase an expense and complexity of the heat pipe. Thus, examples are disclosed that relate to a solid-state heat spreader formed from a reinforced graphitic material. In some examples, a heat spreader of the present disclosure includes a host material of a compressed sheet of graphitic structures, such as graphitic platelets, with elemental carbon deposited between the graphitic structures. The elemental carbon is formed by pyrolysis of an organic compound sorbed between the graphitic structures. The resulting reinforced graphitic thermal conductor may be more easily machinable than native graphite, may have good thermal conductivity, and may be sufficiently flexible to be used as a heat spreader in a wearable electronic device. Further, a reinforced graphitic material according to the present disclosure may be used in other applications besides heat spreading.

The terms 'graphene', 'graphite', and 'graphitic' are used in this disclosure. 'Graphene' refers to a single layer of carbon atoms arranged hexagonally, each atom having three nearest neighbors. A graphene layer may be flat or rolled into the form of a tube; it may include hydrogen- or hetero-atom end groups. A graphene layer may include an arbitrary number of defects, which may allow arbitrary curvature. 'Graphene' also refers to an assembly of two or more graphene layers, as described above, arranged in parallel. 'Graphite' is natural or synthetic material composed of many parallel graphene layers with a regular spacing and three-dimensional structure. A 'graphitic' material is a material having the structure of graphene or graphite, at least in part.

It will be noted that the drawing figures included in this disclosure are schematic and may not be drawn to scale. Rather, the various drawing scales, aspect ratios, and numbers of components shown in the figures may be distorted to make certain features or relationships easier to see.

FIG. 1 shows aspects of an example electronic device 10 to be worn on a user's head. The illustrated electronic device includes a frame 12. The frame supports stereoscopic, see-through display componentry, which is positioned close to the user's eyes. Accordingly, the electronic device may be used in augmented-reality applications, where real-world imagery is admixed with virtual display imagery.

Electronic device 10 includes separate right and left display panels 14R/14L, cameras 16A/16B, and a computer system 18. The computer system is operatively coupled to the display panels, cameras, and other componentry. The computer system includes logic and associated computer memory configured to provide image signal to the display panels, to receive video from the cameras, and to enact various control processes of the electronic device. The computer system may include a wired or wireless interface for exchanging data with a remote computer system, and/or receiving power from an external power source. Electronic device 10 may also include a local power source comprising a replaceable or rechargeable battery.

The various active components of electronic device 10 may generate significant heat during operation. The electronic device therefore includes at least one heat sink 20 configured to release such heat into the environment. In the illustrated embodiment, the heat sink is located on the back portion of frame 12, but may have any other suitable location. To convey the heat from the active components back to the heat sink, a heat spreader 22 is provided. The heat spreader may be machined or otherwise formed from a thermally conductive material.

Among the thermally conductive materials suitable for heat spreader 22, natural and synthetic graphite and multilayer graphene may provide various advantages. Graphite is light-weight, low-cost, chemically and environmentally inert, heat resistant, and exhibits a low to negative coefficient of thermal expansion. Further, graphite has a high thermal conductivity in directions parallel to its graphene planes. These properties are shared also by graphene multilayers grown by chemical vapor deposition (CVD) or physical vapor deposition (PVD). Natural graphite, synthetic pyrolytic graphite, and graphene are available in the form of thin sheets, which may be stackable for increased thermal conductance. Individual sheets may be connected with intervening adhesive layers if loss of conduction in the cross-plane direction is tolerable.

However, the anisotropy of such graphitic materials may make them difficult to machine. In particular, graphite and graphene are mechanically strong in some directions, but weak in others. As such, one approach to helping improve the mechanical strength of such graphitic materials involves creation of pyrolytic graphene bridges between the individual platelets of a graphitic host material. Briefly, an organic compound such as sucrose is dissolved in water or another solvent and introduced into the void space between the graphitic platelets of the host material. The solution-saturated host is then heated to high temperatures in a reduced-oxygen environment. In this manner, the organic compound sorbed into the void space is converted into pyrolytic elemental carbon, which may in some examples have a graphene structure. In other examples, the pyrolytic elemental carbon may be associated with one or more heteroatoms, such as oxygen. The pyrolytic elemental carbon may form graphene-oxide chains, for instance. In any case, the pyrolytic elemental carbon may crosslink the graphitic platelets of the host material with thermally conductive graphene bridges, which may provide mechanical strength, flexibility, and increased thermal conductivity, relative to the host material alone.

Figure 2:
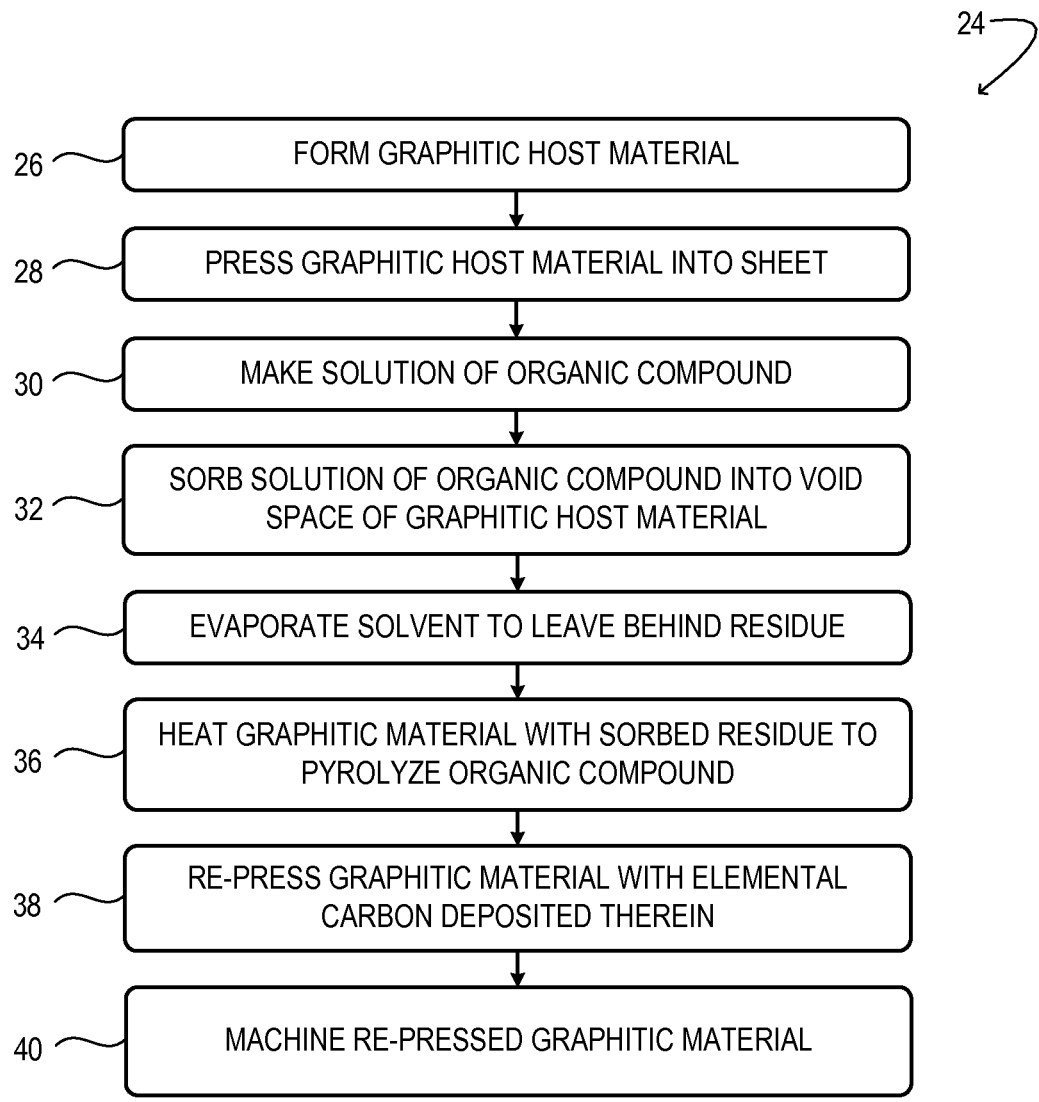
FIG. 2 illustrates an example method for making a reinforced graphitic material.

FIG. 2 illustrates an example method 24 for making a solid-state heat spreader using a reinforced graphitic material. At 26 of method 24, a graphitic host material is formed. In one embodiment, the graphitic host material may include graphene, which may be formed by chemical vapor deposition of carbon. The graphitic host material formed in this manner may include graphene-tube and/or graphene-flower microstructures. In some examples, the graphitic host material may include graphene-based flakes 100 to 1000 micrometers in thickness. In a more specific embodiment, the average thickness of the graphene-based flakes may be about 500 micrometers. In yet other examples, graphene based flakes may have a thickness either greater or lesser than the above-stated range. In other implementations, the graphitic host material may include natural or synthetic graphite—e.g., pyrolytic graphite.

At 28 the graphitic host material is pressed into a sheet of suitable thickness for the desired application, which may include a heat-spreader application. At this stage, the graphitic host material may include some amount of void space. In some examples, the graphitic host material may include from 10 to 20% void space by volume. In a more particular example, the graphitic host material may include 15% void space.

At 30, a solution is made by dissolving an organic compound in a solvent. In some examples, the organic compound may include a carbohydrate, such as a sugar (e.g., a monosaccharide or disaccharide) or a starch. In a more particular embodiment, the organic compound may include sucrose, fructose, or glucose. In these and other embodiments, the solvent may include water. In some examples, the solution may also include a catalyst to promote pyrolysis of the organic compound into elemental carbon at reduced temperatures.

At 32 the solution containing the organic compound is sorbed into the void space of the graphitic host material. In some examples, the solution may be permitted to wick into the graphitic host material under the influence of capillary forces. To promote wicking, the solution of the organic compound may include a low concentration of a surfactant. In other examples, air or gas initially present in the void space may be removed under vacuum, to facilitate filling of the void space by the solution. In some examples, the graphitic host material may be dipped into the solution. In some examples, the solution may be sprayed onto or into the graphitic host material.

At 34 the solvent is evaporated to leave behind a sorbed residue of the organic compound in the void space of the graphitic host material. In one example, the solvent may be evaporated under heat and mechanical pressure, to deter expansion caused by increasing pressure of the evaporating solvent. In one particular example, the graphitic host material may be loaded up to 10,000 pounds per square inch (PSI) and heated up to 1000° C. for approximately 1 hour.

At 36 the graphitic host material with sorbed residue is heated to pyrolyze the organic compound and thereby deposit elemental carbon in the void space. The term 'pyrolyze,' as used herein, means to heat to a high temperature and cause decomposition. Pyrolysis of the organic compound yields at least some elemental carbon. In some embodiments, the organic compound may be converted entirely into elemental carbon, which stays in the host material, plus volatiles that exit the host material. In other embodiments, the pyrolysis may be incomplete, so that at least some non-carbon atoms remain in the host material. The pyrolysis may yield graphene oxide, for instance. In some examples, the material may be heated under vacuum (e.g., 1 Torr or less). In some examples, the material may be heated under a low pressure atmosphere of a relatively inert gas (e.g., helium, nitrogen, or argon). In one specific example, the material may be heated to 2700° C. for at least one hour. In another example, the material may be heated to 3000° C. or higher. This stage of processing yields a reinforced graphitic material—i.e., a graphitic host material with elemental carbon deposited therein.

At 38 the reinforced graphitic material is mechanically re-pressed. In one embodiment, the material may be re-pressed to 10,000 PSI at 1000° C. At 40 the re-pressed material is machined into the shape desired for the solid-state heat spreader, or other application.

No aspect of the foregoing method should be interpreted in a limiting sense, for numerous extensions, omissions, and variations are contemplated as well. For instance, while evaporation of the solvent at 34 may be achieved at temperatures at which the organic compound is not pyrolyzed, it is also envisaged that solvent evaporation and pyrolysis may be accomplished at the same heating stage—viz., by heating directly to temperatures sufficient to pyrolyze the organic compound. Further, while the specific examples of pyrolyzable organic compounds included sugars, this aspect is by no means necessary, as any compound that pyrolyzes to a substantially pure carbon residue may be used instead. Additionally, any suitable solvent may be used to introduce the pyrolyzable organic compounds into the host, and any other suitable processing conditions may be used for the various steps of the pyrolysis process.

Figure 3A:
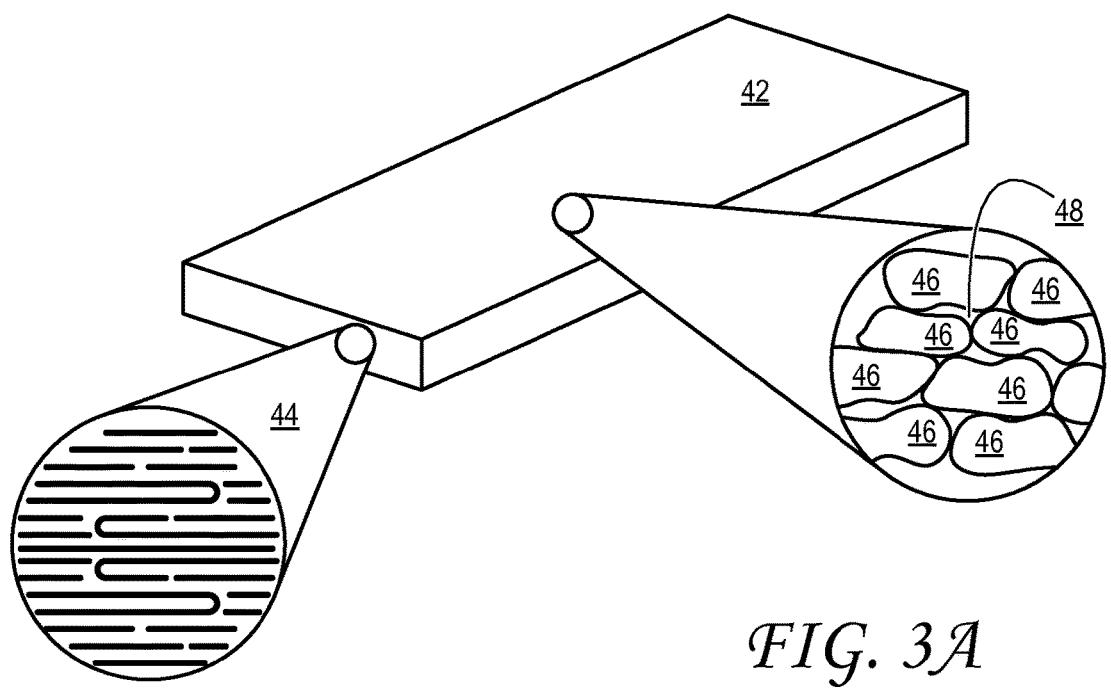
FIGS. 3A and 3B show aspects of a reinforced graphitic material formed via the method of FIG. 2.
Figure 3B:
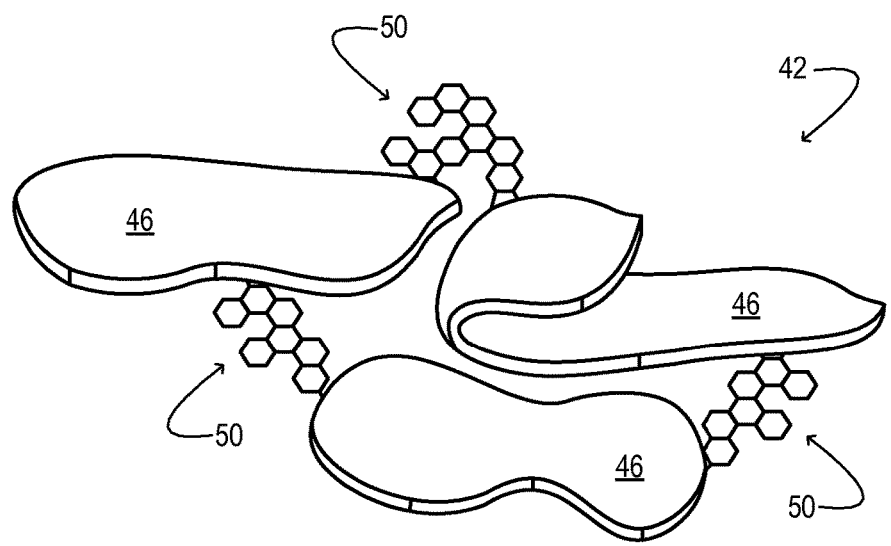

FIG. 3A schematically shows aspects of an example heat-spreading product or other machinable, flexion-tolerant, reinforced graphitic product of the above method. In particular, the figure shows a sheet 42 of a graphitic host material. The graphitic host material is anisotropic, comprising a plurality of layers 44. Each layer includes a plurality of graphitic platelets 46, with void space 48 between the platelets. FIG. 3B is a magnified view of sheet 42. In some embodiments, the graphitic platelets of the host material may be not be curved and/or oriented at least somewhat randomly.

In FIG. 3B, elemental carbon 50 is deposited between the graphitic platelets of the host material. The elemental carbon is formed by pyrolysis of the organic compound that was sorbed between the platelets. The elemental carbon may include pyrolytic graphene, as shown in the drawing. In this and other embodiments, the elemental carbon may include other forms of carbon—e.g., amorphous, glassy, or diamond-like carbon, carbon nanotubes, and/or fullerenes.

Another example provides a method for making a reinforced graphitic material. The method comprises sorbing an organic compound into void space of a graphitic host material; and heating the graphitic host material with the sorbed organic compound to pyrolyze the sorbed organic compound and thereby deposit elemental carbon in the void space. In some implementations, the graphitic host material may alternatively or additionally include graphene. In some implementations, the graphitic host material alternatively or additionally may include graphene flakes 100 to 1000 micrometers in thickness. In some implementations, the graphitic host material alternatively or additionally may include from 10 to 20% void space by volume. The method above alternatively or additionally may further comprise the act of forming the graphitic host material by one or more of chemical vapor decomposition and physical vapor deposition. In some implementations, the organic compound alternatively or additionally may include a carbohydrate. In some implementations, the organic compound alternatively or additionally may include a sugar. In some implementations, sorbing the organic compound into the void space alternatively or additionally may include making a solution by dissolving the organic compound in a solvent; sorbing the solution into the void space; and evaporating the solvent to leave a sorbed residue of the organic compound in the void space. In some implementations, the solvent alternatively or additionally may include water. In some implementations, evaporating the solvent alternatively or additionally may include evaporating under heat and applied mechanical pressure. In some implementations, evaporating under heat and mechanical pressure alternatively or additionally may include evaporating at a temperature at which the organic compound is not pyrolyzed. In some implementations, the solution alternatively or additionally may include a surfactant. In some implementations, heating the graphitic host material with the sorbed organic compound alternatively or additionally may include heating under vacuum. In some implementations, heating the graphitic host material with the sorbed organic compound alternatively or additionally may include heating under an inert atmosphere. The method above alternatively or additionally may further comprise mechanically re-pressing the graphitic host material after heating the graphitic host material with the sorbed organic compound. The method above alternatively or additionally may further comprise machining the graphitic host material with the elemental carbon deposited therein.

Another example provides a method for making a heat spreader. The method comprises making a solution by dissolving an organic compound in a solvent; sorbing the solution into void space of a graphitic host material; evaporating the solvent to leave behind a sorbed residue of the organic compound in the void space; heating the graphitic host material with the sorbed organic compound to pyrolyze the organic compound and thereby deposit elemental carbon in the void space; and mechanically re-pressing the graphitic host material with the elemental carbon deposited therein.

Another example provides a heat spreader comprising a host material composed of a plurality of graphitic platelets; and elemental carbon deposited between the graphitic platelets of the host material, the elemental carbon formed by pyrolysis of an organic compound sorbed between the platelets. In some implementations, the graphitic platelets alternatively or additionally are oriented randomly in the host material. In some implementations, the elemental carbon includes pyrolytic graphene.

The configurations and approaches described herein are exemplary in nature, and that these specific implementations or examples are not to be taken in a limiting sense, because numerous variations are feasible. The specific routines or methods described herein may represent one or more processing strategies. As such, various acts shown or described may be performed in the sequence shown or described, in other sequences, in parallel, or omitted.

The subject matter of this disclosure includes all novel and non-obvious combinations and sub-combinations of the various processes, systems and configurations, and other features, functions, acts, and/or properties disclosed herein, as well as any and all equivalents thereof.

The invention claimed is:

1. A method for making a reinforced graphitic material, the method comprising:
    sorbing a solution of an organic compound into void space between graphitic platelets of a graphitic host material;
    mechanically pressing the graphitic host material while heating the graphitic host material to evaporate a solvent of the solution and deposit sorbed organic compound into the void space;
    heating the graphitic host material with the sorbed organic compound to pyrolyze the sorbed organic compound and thereby deposit elemental carbon in the void space, the elemental carbon crosslinking the graphitic platelets of the graphitic host material; and
    after heating the graphitic host material with the sorbed organic compound to pyrolyze the sorbed organic compound, mechanically re-pressing while heating the graphitic host material.

2. The method of claim 1, wherein the graphitic host material includes graphene.

3. The method of claim 1, wherein the graphitic host material includes graphene flakes 100 to 1000 micrometers in thickness.

4. The method of claim 1, wherein the graphitic host material includes from 10 to 20% void space by volume prior to sorbing the solution of the organic compound into void space of the graphitic host material.

5. The method of claim 1, further comprising forming the graphitic host material by one or more of chemical vapor decomposition and physical vapor deposition.

6. The method of claim 1, wherein the organic compound includes a carbohydrate.

7. The method of claim 1, wherein the organic compound includes a sugar.

8. The method of claim 1, further comprising:
    making the solution by dissolving the organic compound in the solvent.

9. The method of claim 1, wherein the solvent includes water.

10. The method of claim 1, wherein mechanically pressing the graphitic host material while heating the graphitic host material includes loading the graphitic host material up to 10,000 pounds per square inch.

11. The method of claim 10, wherein mechanically pressing the graphitic host material while heating the graphitic host material includes heating at a temperature at which the organic compound is not pyrolyzed.

12. The method of claim 1, wherein the solution includes a surfactant.

13. The method of claim 1, wherein heating the graphitic host material with the sorbed organic compound includes heating under vacuum.

14. The method of claim 1, wherein heating the graphitic host material with the sorbed organic compound includes heating under an inert atmosphere.

15. The method of claim 1, wherein mechanically re-pressing while heating the graphitic host material comprises loading the graphitic host material up to 10,000 pounds per square inch.

16. The method of claim 1, further comprising machining the graphitic host material with the elemental carbon deposited therein.

17. A method for making a heat spreader, the method comprising:
   making a solution by dissolving an organic compound in a solvent;
   sorbing the solution into void space between graphitic platelets of a graphitic host material;
   mechanically pressing while heating the graphitic host material to evaporate the solvent and leave behind a sorbed residue of the organic compound in the void space;
   heating the graphitic host material with the sorbed residue of the organic compound to pyrolyze the organic compound and thereby deposit elemental carbon in the void space, the elemental carbon crosslinking the graphitic platelets of the graphitic host material; and
   mechanically re-pressing the graphitic host material with the elemental carbon deposited therein.

* * * * *